(12) United States Patent
Waight et al.

(10) Patent No.: US 8,150,362 B2
(45) Date of Patent: Apr. 3, 2012

(54) ELECTRONICALLY TUNED AGILE INTEGRATED BANDPASS FILTER

(75) Inventors: Matthew Waight, Pipersville, PA (US); James Marsh, Sherwood, OR (US); Howard Luong, Renton, WA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 2066 days.

(21) Appl. No.: 10/799,900

(22) Filed: Mar. 12, 2004

(65) Prior Publication Data
US 2004/0198298 A1    Oct. 7, 2004

Related U.S. Application Data

(60) Provisional application No. 60/460,495, filed on Apr. 3, 2003.

(51) Int. Cl.
    *H04B 1/16* (2006.01)
(52) U.S. Cl. .................. 455/339; 455/311; 455/307
(58) Field of Classification Search .............. 455/333, 455/323, 326, 313, 332, 286–290, 293, 306–307, 455/311, 339–341; 333/186, 175; 330/175; 331/100; 327/552
    See application file for complete search history.

(56) References Cited

U.S. PATENT DOCUMENTS

| | | | | |
|---|---|---|---|---|
| 5,263,186 A * | 11/1993 | Gornati et al. | ............. | 455/241.1 |
| 5,543,756 A * | 8/1996 | Anderson | .................. | 333/186 |
| 5,789,964 A * | 8/1998 | Voldman | .................. | 327/380 |
| 5,841,324 A * | 11/1998 | Williams | .................. | 331/17 |
| 6,014,554 A * | 1/2000 | Smith | .................. | 455/340 |
| 6,075,409 A | 6/2000 | Khlat | ............. | 329/304 |
| 6,297,624 B1 * | 10/2001 | Mitsui et al. | ................ | 323/316 |
| 6,453,157 B1 * | 9/2002 | Roberts | .................. | 455/337 |
| 6,700,514 B2 | 3/2004 | Soltanian et al. | ............ | 341/118 |
| 6,720,834 B2 * | 4/2004 | McCarthy et al. | ......... | 331/117 R |
| 6,727,763 B2 * | 4/2004 | Endo | .................. | 331/17 |
| 6,771,945 B1 | 8/2004 | Pickett et al. | ............... | 455/324 |
| 7,002,427 B2 * | 2/2006 | Nystrom et al. | ............. | 333/17.1 |
| 7,034,660 B2 * | 4/2006 | Watters et al. | ............. | 340/10.41 |
| 7,068,788 B2 | 6/2006 | Haque et al. | .................. | 380/265 |
| 7,183,880 B2 * | 2/2007 | Kamata et al. | ................ | 333/174 |
| 7,259,643 B2 * | 8/2007 | Son et al. | .................. | 333/174 |
| 7,495,515 B1 * | 2/2009 | Branch et al. | ................ | 330/305 |
| 7,554,474 B2 | 6/2009 | Le Guillou | | |
| 7,636,559 B2 * | 12/2009 | Magnusen et al. | ........... | 455/266 |
| 7,653,137 B2 * | 1/2010 | Fink et al. | .................. | 375/259 |
| 7,689,193 B2 * | 3/2010 | Lester et al. | .................. | 455/307 |
| 7,715,815 B2 * | 5/2010 | Gomez | .................. | 455/307 |
| 7,764,216 B2 * | 7/2010 | Oshima et al. | ................ | 341/172 |
| 2003/0058054 A1 * | 3/2003 | Endo | .................. | 331/25 |
| 2003/0193373 A1 * | 10/2003 | McCarthy et al. | ............ | 331/100 |
| 2004/0116096 A1 * | 6/2004 | Shen | .................. | 455/323 |
| 2005/0088254 A1 * | 4/2005 | Belk | .................. | 333/174 |
| 2006/0209987 A1 * | 9/2006 | Miyagi et al. | ................ | 375/316 |
| 2006/0217069 A1 | 9/2006 | Chen et al. | .................. | 455/63.1 |
| 2009/0036368 A1 * | 2/2009 | Brest et al. | .................. | 514/12 |
| 2009/0308233 A1 * | 12/2009 | Jacob | .................. | 84/726 |
| 2010/0009645 A1 * | 1/2010 | Der et al. | .................. | 455/173.1 |

\* cited by examiner

*Primary Examiner* — Pablo Tran
(74) *Attorney, Agent, or Firm* — Haverstock & Owens LLP

(57) ABSTRACT

A method and apparatus for an electronically tuned agile integrated bandpass filter is described. In one embodiment, the invention is an intermediate frequency filter for use in an integrated circuit. The filter includes a first filter stage, including a first LC resonator. The first filter stage further includes a first adjustable capacitor array coupled to the first LC resonator. The first adjustable capacitor array has an effective capacitance value adjustable through use of a first plurality of programmable data storage locations. The first plurality of programmable data storage locations are programmable through a serial control interface.

12 Claims, 9 Drawing Sheets

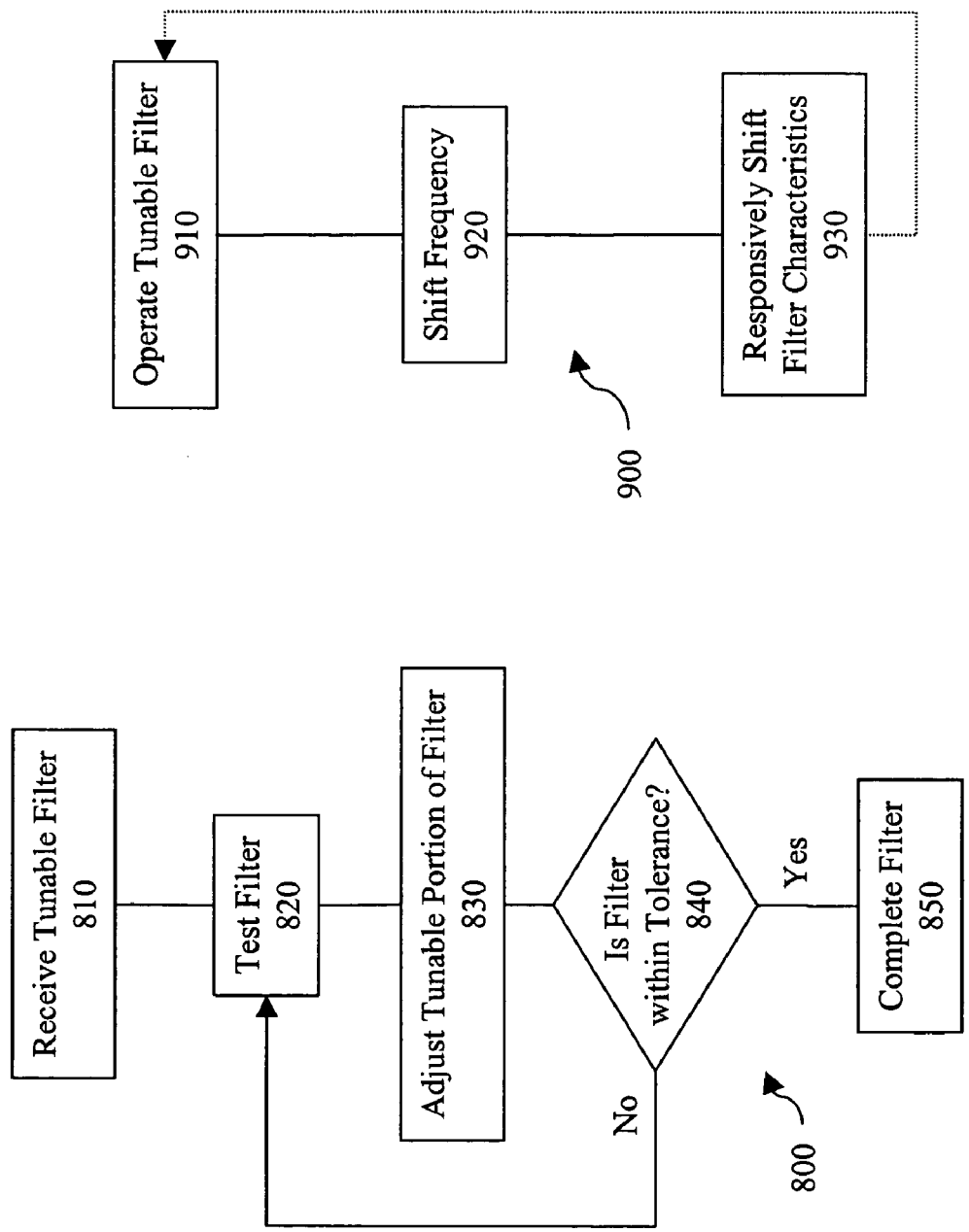

ELECTRONICALLY TUNED AGILE INTEGRATED BANDPASS FILTER

CLAIM OF PRIORITY

This application claims priority to provisional application Ser. No. 60/460,495, entitled "ELECTRONICALLY TUNED AGILE INTEGRATED BANDPASS FILTER" and filed Apr. 3, 2003.

FIELD

The present invention relates to the field of communications systems. More particularly, the present invention relates to electronic circuitry for use in a receiver in a communications system.

BACKGROUND

Increasing use of wireless and high frequency technology in consumer products has resulted in more radiated signals in portions of the spectrum available for such products. Noise of various kinds can be injected into integrated circuits, thus reducing performance. One instance of such noise is beats—interference between two oscillators operating at similar frequencies. Another instance of such noise is harmonics—energy at a frequency related to an oscillator frequency produced due to non-ideal (real-world) aspects of circuit components. Both of these instances of noise are preferably reduced in circuits.

Preferably, blocking or reducing noise injected into circuits and systems is achieved in an inexpensive manner. Noise may be injected due to adjacent channels, image tones, jamming or blocking signals, and for other reasons. However, blocking or reducing noise is not the primary function of a system, it is a necessary addition allowing the rest of the system to perform its intended function, such as receiving encoded television or audio signals for example.

Shown in FIG. 1A is a block diagram illustrating the mixing or converting of a signal by a periodic signal. As shown, a signal, $x(t)=f(t)\cos(\omega_1 t)$, is provided at input 102.

As further shown in FIG. 1A, a periodic signal, $z(t)=2\cos(\omega_1+\omega_2)t$, is provided at input 106 to mixer 104. Note that the frequency, $\omega_1$, is a shifting frequency that for the purposes of the present discussion can be a negative value. The Fourier transform, $Z(s)$, of the periodic signal, $z(t)$, is written as $$Z(s) = \frac{2\pi}{\omega_1+\omega_2}\Pi\left(\frac{\pi}{\omega_1+\omega_2}s\right) = $$
$$\frac{\pi}{\omega_1+\omega_2}\left[\delta\left(\frac{\pi}{\omega_1+\omega_2}s+\frac{1}{2}\right)+\delta\left(\frac{\pi}{\omega_1+\omega_2}s-\frac{1}{2}\right)\right]$$

which can be rewritten as $$Z(s) = \delta\left(s+\frac{\omega_1+\omega_2}{2\pi}\right)+\delta\left(s-\frac{\omega_1+\omega_2}{2\pi}\right).$$

Both the signal, $x(t)$, and the periodic signal, $z(t)$, are then provided to the inputs of mixer 104. The resulting signal, $e(t)$, at output 108 is therefore the product, $e(t)=x(t)z(t)$ whose Fourier transform is the convolution, $E(s)=X(s)*Z(s)$. From the above results for $X(s)$ and $Z(s)$ and after some mathematical manipulation, we have:

$$E(s) = X(s)*\delta\left(s+\frac{\omega_1+\omega_2}{2\pi}\right)+\delta\left(s-\frac{\omega_1+\omega_2}{2\pi}\right)$$

$$E(s) = X\left(s+\frac{\omega_1+\omega_2}{2\pi}\right)+X\left(s-\frac{\omega_1+\omega_2}{2\pi}\right)$$

$$E(s) = \frac{1}{2}F\left(s+\frac{2\omega_1+\omega_2}{2\pi}\right)+\frac{1}{2}F\left(s-\frac{\omega_2}{2\pi}\right).$$

Thus, in the time domain, we have the inverse Fourier transform, $e(t)$, as $$e(t)=f(t)\cos((2\omega_1+\omega_2)t)+f(t)\cos(\omega_2 t)$$

Note that the first term, $f(t)\cos((2\omega_1+\omega_2)t)$, is undesired and is therefore filtered out using filter 110. The output 112 of filter 110 is therefore $$e'(t)=f(t)\cos(\omega_2 t).$$

Thus, the filtered output signal, $e'(t)$, is a shifted version of the input signal, $x(t)$.

Mixer 100 of FIG. 1A can be used as part of a television tuner including single-conversion and dual-conversion television tuners for example. More recently, dual conversion tuners find wide application in television and cable tuners. In a dual conversion television tuner, as the name implies, two conversions (i.e., two mixers) are implemented. Moreover, in a dual conversion television tuner, the input frequency, $\omega_1+2\omega_2$, to bandpass filter 110 is referred to as an image frequency of the desired frequency, $\omega_1$. The image frequency can sometimes be a problem and therefore may be filtered in such television tuner applications.

In a dual-conversion architecture 150, such as that shown in FIG. 1B, a first mixer 104 is implemented that up-converts a received RF signal, $x(t)$, at input 102 to a signal, $e(t)$, at mixer output 108 having a first intermediate frequency that is then filtered by filter 110 (note that like-numbered components between FIG. 1A and FIG. 1B operate similarly). The filtered signal, $e'(t)$, at input 112 to mixer 114 is then at a nominal amplitude while all the rejected signals are at a much lower amplitude. The filtered signal, $e'(t)$, is then input to a second mixer 114 where $e'(t)$ is mixed with signal $y(t)$ at input 116 to down-convert the filtered signal, $e'(t)$, into a desired IF signal, $m(t)$, at output 118. The desired IF signal, $m(t)$, is the channel a user wishes to view. In actual implementation, amplification of signals and other factors need to be considered.

Using the techniques described above, a prior art tuner 200 is built as shown in FIG. 2. Tuner 200 includes dual mixers 202 and 204 which are similar in operation to mixers 104 and 114 described with reference to FIG. 1B. Dual mixers 202 and 204 receive local oscillator signals from local oscillators LO1 264 and LO2 268 at mixer inputs 206 and 208, respectively. Oscillator circuit 210 drives local oscillators LO1 264 and LO2 268 responsive to external clock signal 212 generated by crystal 214. As shown in FIG. 2, crystal 214 generates external clock signal 212 with a frequency of 5.25 MHz. External clock signal 212 is then directed to reference frequency generator 240 which generates a reference signal for phased lock loop PLL1 220 of oscillator circuit 210 which provides input signal 262 to local oscillator LO1 264. External clock signal 212 is further directed to reference frequency generator 216. Using external clock signal 212 with a frequency of 5.25 MHz, reference frequency generator generates reference signal 218 operating at 2.625 MHz. Reference signal 218 is then directed to oscillator circuit 210 and, more particularly, to phase locked loop PLL2 228. Using the reference signal 218, phase locked loop PLL2 228 is configured to provide signal 266 to local oscillator LO2 268.

Tuner 200 can be configured or implemented to operate in television systems where, for example, signals representing individual channels are assigned to specific frequencies in a defined frequency band. Illustratively, in the United States, television signals are generally transmitted in a band from 55 MHz to 806 MHz. Such a radio frequency (RF) signal can, therefore, be received at input 230 of tuner 200. The received RF signal passes through a front-end filter 232 that filters out any signals outside of the frequency range of interest (i.e., outside of 55 MHz to 806 MHz). Filter 232 can be a bandpass filter or, more typically, a low pass filter that is designed to remove all frequencies above an input cutoff frequency, $\omega_c$. The input cutoff frequency, $\omega_c$, is chosen to be higher than the frequencies of the channels in the television band. The output 234 of filter 232 is then directed to amplifier 236 to provide the signal (238) that is then directed to mixer input 238 of mixer 202. As described above, mixer 202 also receives at input 206 a local oscillator signal from local oscillator LO1 264.

The output 242 of mixer 202 is a first intermediate frequency signal IF1 which is directed to IF filter 244. Typically, the frequency of local oscillator LO1 264 is variable and selected responsive to a desired channel in the RF signal at input 230. Moreover, the frequency local oscillator LO1 264 is selected such that mixing of the local oscillator signal at input 206 and the filtered and amplified signal at mixer input 238 generates signal IF1 at a specified frequency or within a narrow range of frequencies as may be desired. ° F. filter 244 is a band pass filter that is used to remove unwanted frequencies and spurious signals from the signal IF1. The output of ° F. filter 244 is then directed to mixer input 246 of mixer 204 which also receives a second local oscillator signal at input 208 that is generated by local oscillator LO2 268. Mixer 204 mixes these signals to generate a second intermediate frequency signal, IF2, which is then directed to input 248 of amplifier 250. In television tuner applications, mixer 204 may be an image rejection mixer that rejects image frequencies from the second intermediate frequency signal, IF2.

Local oscillator signal LO2 268 can be implemented to generate a variable or fixed frequency signal depending upon whether the first intermediate frequency signal, IF1, is at a fixed frequency or if it varies over a range of frequencies. Regardless, the frequency of the signal generated by local oscillator LO2 268 is selected to generate a fixed frequency signal IF2 that is directed to input 248 of amplifier 250. Output 252 of amplifier 250 is, therefore, amplified signal IF2' that is directed to additional processing circuitry 254 to generate either digital or analog television signals as may be desired. Further included in tuner 200 is serial control circuitry 256. Among other things, serial control circuitry 256 controls phased locked loops PLL1 and PLL2 to set the frequencies of local oscillators LO1 264 and LO2 268.

Advances have been made to integrate much circuitry into a single integrated circuit. Prior art applications typically integrate the circuitry enclosed by box 258. Notably, front end filter 232 and IF filter 244 are typically placed outside of an integrated circuit. This is not surprising because of the size and other design considerations of such filters. The present invention, however, teaches a manner for integrating IF filter 244 onto a tuner IC.

SUMMARY

A method and apparatus for an electronically tuned agile integrated bandpass filter is described. In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

In one embodiment, the invention is an intermediate frequency filter for use in an integrated circuit. The filter includes a first filter stage, including a first LC resonator. The first filter stage further includes a first adjustable capacitor array coupled to the first LC resonator. The first adjustable capacitor array has an effective capacitance value adjustable through use of a first plurality of programmable data storage locations. The first plurality of programmable data storage locations are programmable through a serial control interface.

In an alternate embodiment, the invention is a circuit formed as part of a single integrated circuit. The circuit includes a first amplifier, a first oscillator, and a first mixer coupled to the first amplifier and the first oscillator. The circuit also includes a second oscillator, a second mixer coupled to the second oscillator, and a second amplifier coupled to the second mixer. The circuit further includes a serial control module and an intermediate frequency filter (IF filter). The IF filter includes a first filter stage, including a first LC resonator. The first filter stage further includes a first adjustable capacitor array coupled to the first LC resonator. The first adjustable capacitor array has an effective capacitance value adjustable through use of a first plurality of fuses, the first plurality of fuses programmable through the serial control module. The second mixer is coupled to the IF filter and the IF filter is coupled to the first mixer. Note that the various components may or may not all be formed on the integrated circuit. For example, an inductor of an LC resonator may be formed outside the integrated circuit and coupled to the integrated circuit.

In another alternate embodiment, the invention is a method of tuning an integrated circuit. The method includes receiving an integrated circuit having therein an intermediate filter with a first tunable capacitive array. The method further includes testing the integrated circuit. The method further includes adjusting the first tunable capacitive array responsive to the testing, to effect a change in a frequency response of the intermediate filter. The method also includes repeating the testing and the adjusting as needed to achieve a desired frequency response of the intermediate filter.

In yet another alternate embodiment, the invention is a method of tuning an integrated circuit during operation. The method includes operating the integrated circuit. The method also includes adjusting a tunable capacitive array to effect a change in frequency response of an intermediate filter.

In yet another alternate embodiment, the invention is an apparatus. The apparatus includes a means for filtering an intermediate frequency signal on an integrated circuit. The apparatus also includes a first means for adjusting a response of the means for filtering. The apparatus further includes a means for programming the first means for adjusting.

In still another alternate embodiment, the invention is an intermediate frequency filter for use in an integrated circuit. The filter includes a first filter stage. The first filter stage includes a first LC resonator of which at least a capacitor is part of the integrated circuit. The first filter stage further includes a first adjustable capacitor array in the integrated circuit coupled to the first LC resonator. The first adjustable capacitor array has an effective capacitance value which is adjustable through use of a first plurality of programmable data storage locations.

BRIEF DESCRIPTION OF THE DRAWINGS

The accompanying drawings, which are incorporated in and form a part of this specification, illustrate embodiments of the invention and, together with the description, serve to explain the principles of the invention. The drawings should be understood as illustrative of the invention, rather than restrictive.

FIG. 8 is a flow diagram of an embodiment of a method of tuning an IF filter.

FIG. 9 is a flow diagram of an alternate embodiment of a method of tuning an IF filter.

DETAILED DESCRIPTION

Figure 1A:
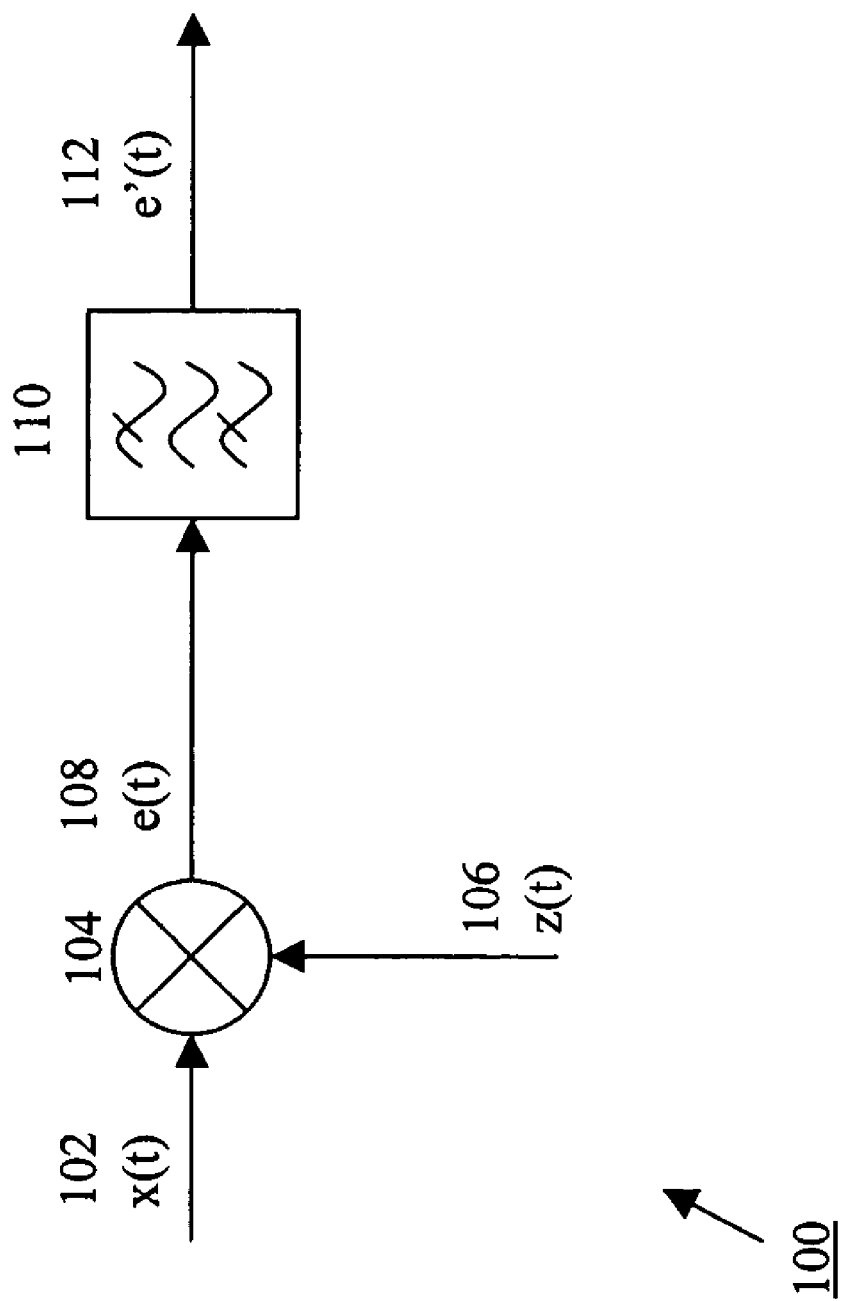
FIG. 1A is a block diagram of an embodiment of a system for up-converting a signal at a first frequency to an intermediate frequency.
Figure 1B:
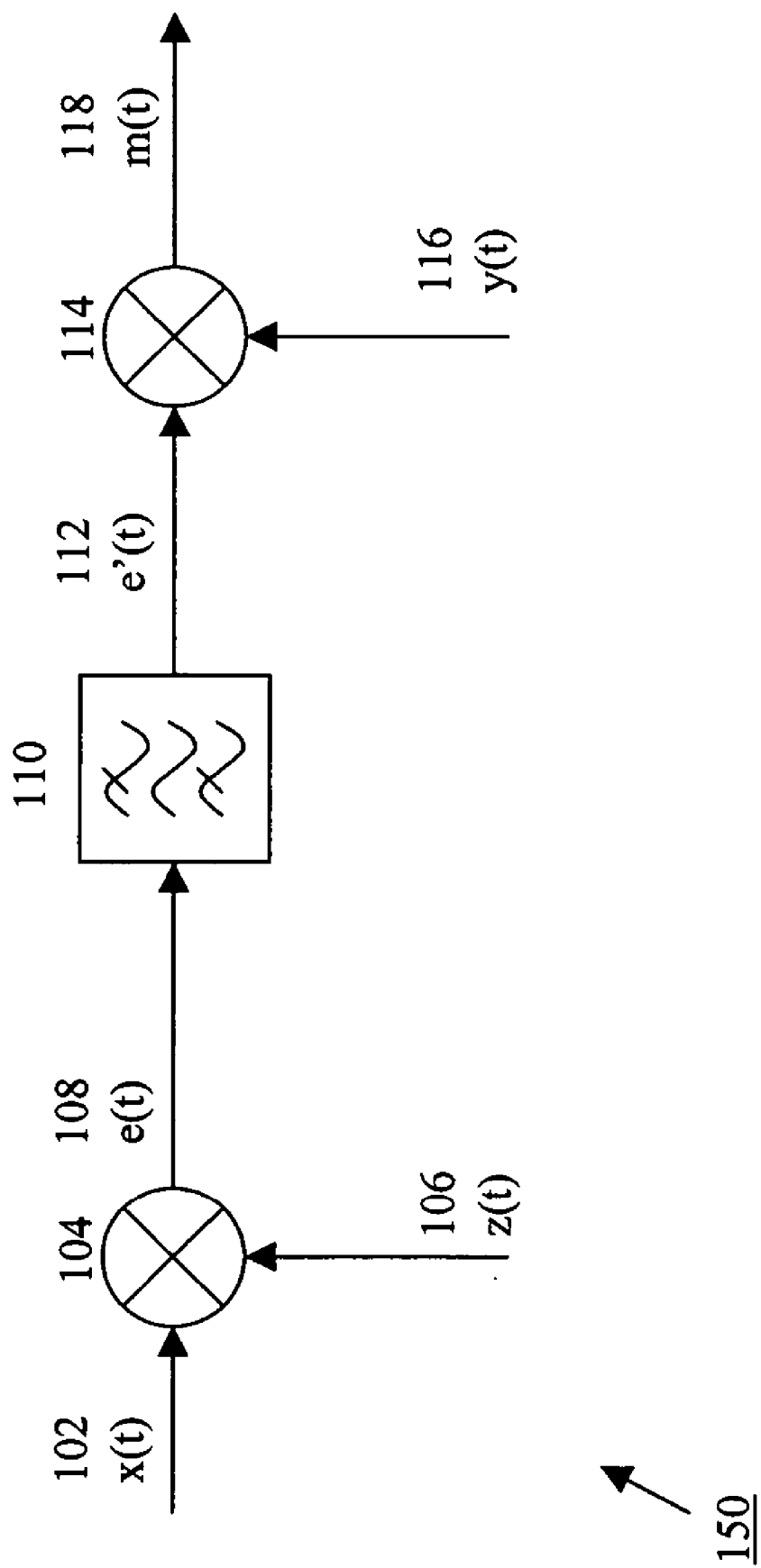
FIG. 1B is a block diagram of an embodiment of a dual conversion system for up-converting a signal at a first frequency to a first intermediate frequency and then down-converting the first intermediate frequency to a second frequency.

A method and apparatus for an electronically tuned agile integrated bandpass filter is described. In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

In order to understand the present invention, it is useful to understand a tuner according to the prior art. Multiplying a lowpass signal by a high-frequency periodic signal translates the spectrum of the lowpass signal to all frequencies present in the periodic signal. Quite often it is desirable to translate a bandpass signal to a new center frequency. This process can be accomplished by multiplication of the bandpass signal by a periodic signal and is called mixing or converting.

The present invention, in one embodiment, provides a bandpass filter including integrated, fixed value inductors and capacitors with electronically controlled, switchable capacitors having a binary weighting. Such capacitors are used to correct for fixed-component variations and to provide a variable passband response. As will be described, in some embodiments, a binary weighting is used for reduced complexity and increased range in tuning. The invention, in one embodiment, is used to create an accurate bandpass filter having reduced passband bandwidth and improved image rejection performance while also reducing the insertion loss of the bandpass filter.

In one embodiment, the invention is an intermediate frequency filter for use in an integrated circuit. The filter includes a first filter stage, including a first LC resonator. The first filter stage further includes a first adjustable capacitor array coupled to the first LC resonator. The first adjustable capacitor array has an effective capacitance value adjustable through use of a first plurality of programmable data storage locations. The first plurality of programmable data storage locations are programmable through a serial control interface.

In an alternate embodiment, the invention is a circuit formed as part of a single integrated circuit. The circuit includes a first amplifier, a first oscillator, and a first mixer coupled to the first amplifier and the first oscillator. The circuit also includes a second oscillator, a second mixer coupled to the second oscillator, and a second amplifier coupled to the second mixer. The circuit further includes a serial control module and an intermediate frequency filter (IF filter). The IF filter includes a first filter stage, including a first LC resonator. The first filter stage further includes a first adjustable capacitor array coupled to the first LC resonator. The first adjustable capacitor array has an effective capacitance value adjustable through use of a first plurality of fuses, the first plurality of fuses programmable through the serial control module. The second mixer is coupled to the IF filter and the IF filter is coupled to the first mixer. Note that the various components may or may not all be formed on the integrated circuit. For example, an inductor of an LC resonator may be formed outside the integrated circuit and coupled to the integrated circuit.

In another alternate embodiment, the invention is a method of tuning an integrated circuit. The method includes receiving an integrated circuit having therein an intermediate filter with a first tunable capacitive array. The method further includes testing the integrated circuit. The method further includes adjusting the first tunable capacitive array responsive to the testing, to effect a change in a frequency response of the intermediate filter. The method also includes repeating the testing and the adjusting as needed to achieve a desired frequency response of the intermediate filter.

In yet another alternate embodiment, the invention is a method of tuning an integrated circuit during operation. The method includes operating the integrated circuit. The method also includes adjusting a tunable capacitive array to effect a change in frequency response of an intermediate filter.

In yet another alternate embodiment, the invention is an apparatus. The apparatus includes a means for filtering an intermediate frequency signal on an integrated circuit. The apparatus also includes a first means for adjusting a response of the means for filtering. The apparatus further includes a means for programming the first means for adjusting.

In still another alternate embodiment, the invention is an intermediate frequency filter for use in an integrated circuit. The filter includes a first filter stage. The first filter stage includes a first LC resonator of which at least a capacitor is part of the integrated circuit. The first filter stage further includes a first adjustable capacitor array in the integrated circuit coupled to the first LC resonator. The first adjustable capacitor array has an effective capacitance value which is adjustable through use of a first plurality of programmable data storage locations.

Figure 2:
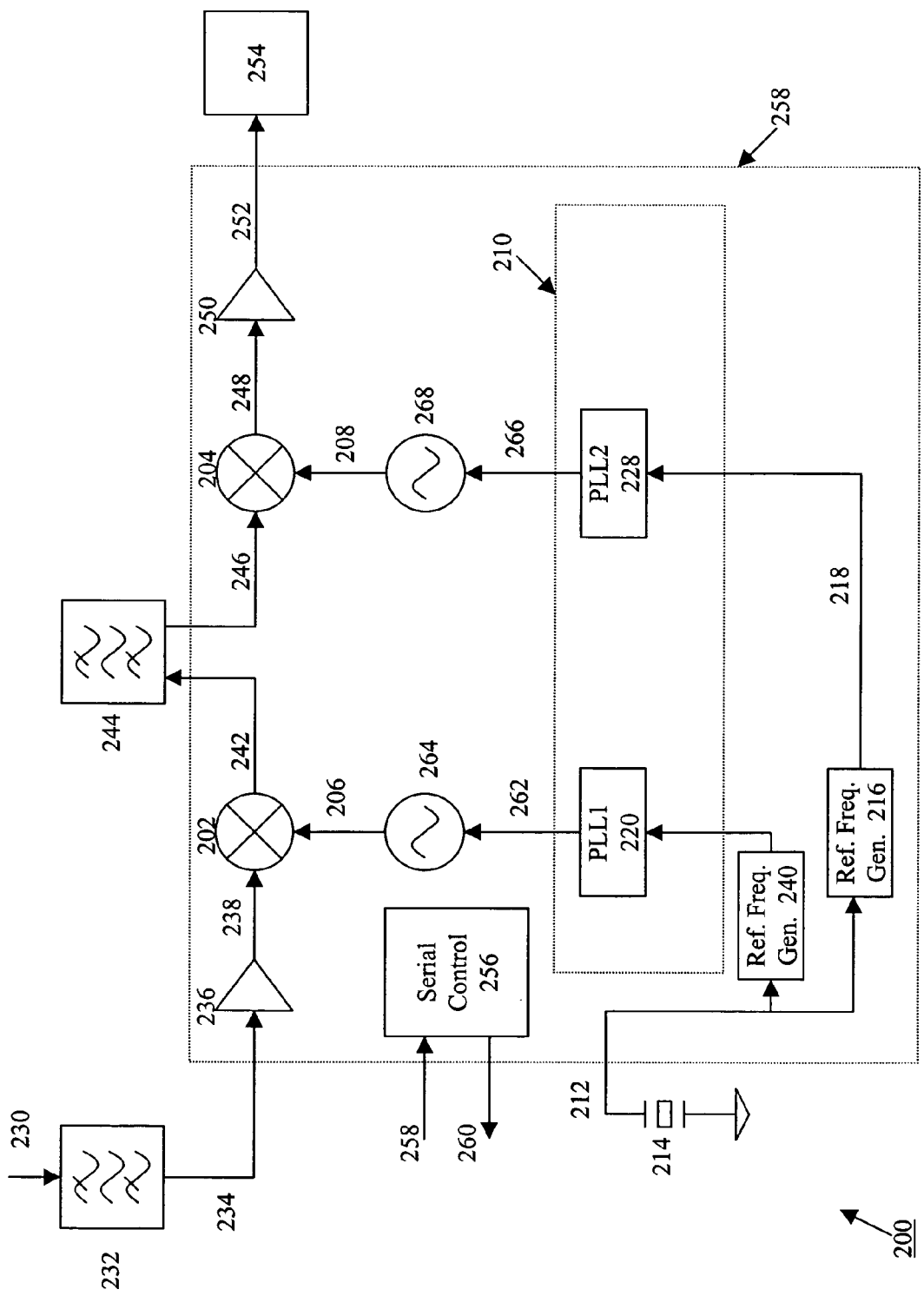
FIG. 2 is a block diagram of an embodiment of a dual-conversion tuner with an external IF filter according to the prior art.

The implementation of switched-capacitor elements allows for correction of fixed element tolerances which cannot be avoided. For example, inductors and capacitor values are typically provided with an identified tolerance (e.g., 10% tolerance) such that when included in a circuit, the accumulation of tolerance errors cannot be accurately predicted. The switched-capacitor elements of the present invention allow for the correction of filter performance and response that may be affected by fixed element tolerances. When used with an image rejection mixer, the present invention provides a major advantage over the prior art by eliminating an expensive external IF filter such as filter 244 of FIG. 2.

The present invention is appropriate for use in over-the-air television applications as well as broadband cable tuner applications. Furthermore, the present invention has many other applications where costly or undesirable external filters are used in receiver or transmitter systems. Note that an entire external filter is different from external components which make up part of an internal filter. For example, in some embodiments, an inductor may be external to the rest of an integrated internal filter, yet be part of the LC resonator of such a filter. In other embodiments, such an inductor may be formed as part of the same integrated circuit on the same substrate as the rest of an internal filter.

Figure 3:
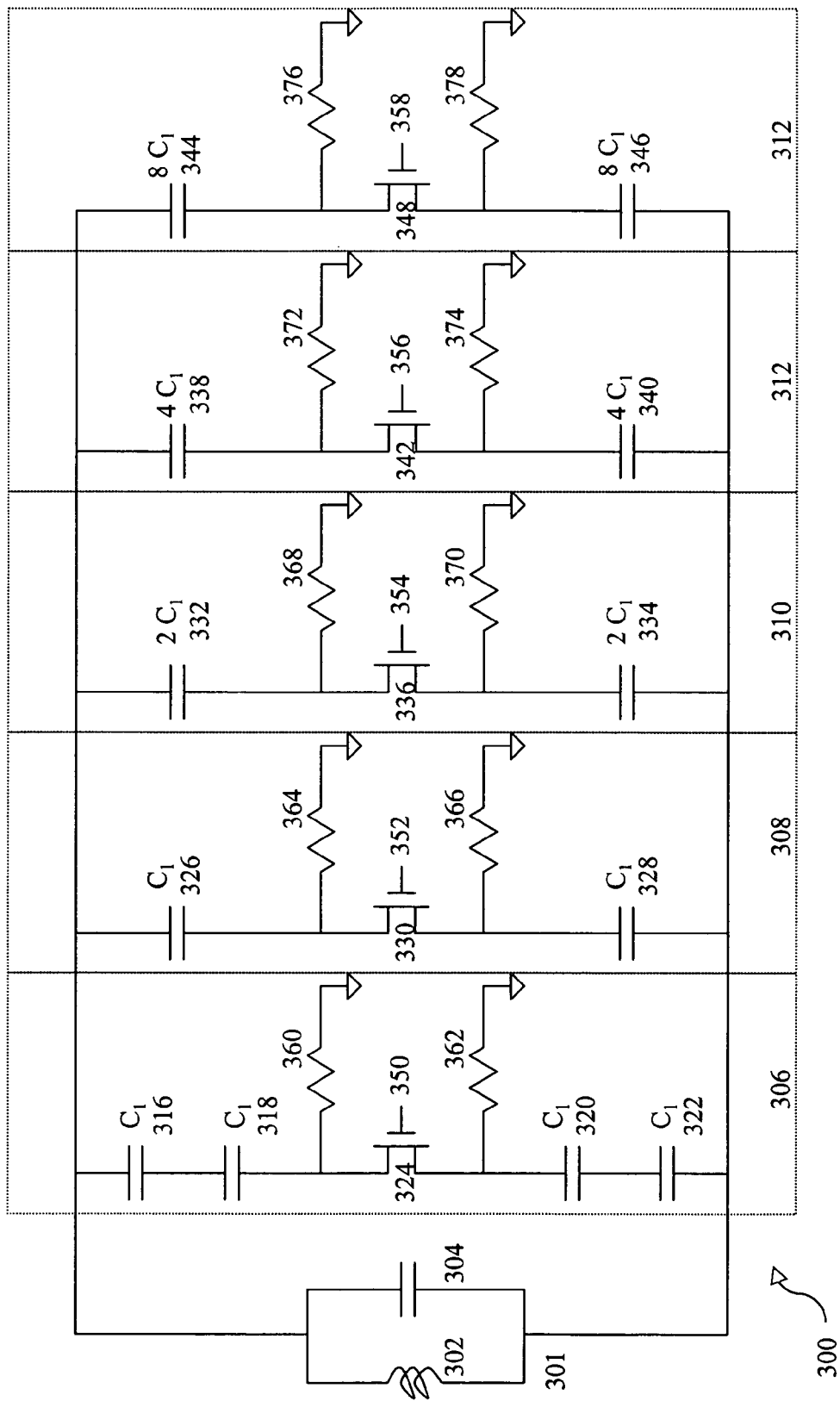
FIG. 3 is a schematic of an embodiment of a switched capacitor resonator that tunes a fixed value LC resonator by coupling and decoupling various capacitors.

As a starting point, a simple filter including a switched capacitive array is illustrated. With reference to FIG. 3, a switched capacitor resonator 300 is illustrated and includes a fixed LC resonator 301 coupled to various switched capacitors 306 through 314. As shown inductor 302 in combination with capacitor 304 collectively form a resonator with an associated time constant. The production of integrated circuits and in particular, integrated tuners, introduces significant variance in component values especially in high-Q inductors. In some embodiments, fixed LC resonator 301 of the present invention provides high-Q inductors by placing a thick layer of metal on a top-most layer of semiconductor die when using an insulating type wafer (such as a silicon-on-insulator structure for example). In some embodiments, silicon-on-insulator may be particularly advantageous, as it prevents active device latchup due to substrate currents and provides high substrate resistivity, thereby helping the Q of on-chip inductors and minimizing parasitic capacitance.

Production of an integrated circuit with inductor 302 and capacitor 304 can be designed for a particular value, however, in actual implementation a slightly different time constant may be required for optimal operation. Thus, in an embodiment of the invention, switched capacitors 306 through 314 are provided as an adjustment to fixed LC resonator 301. Similarly, in some embodiments, it may be useful to provide an external inductor as inductor 302, in which case the variable aspect of inductance will result from a combination of variations in inductor 302 and variations in connections to inductor 302.

In FIG. 3, switched capacitor 306 is illustrated including several components such as capacitors 316 through 322 and transistor 324. Transistor 324 is preferably operated as a binary device that is either in the fully on state or the fully off state. In the on state, transistor 324 provides a low impedance connection between capacitors 318 through 320. Moreover, in such a state, capacitors 316 through 322 become coupled to fixed LC resonator 301. Series coupled capacitors 316 through 322, each with value $C_1$ produces an equivalent capacitance of $\frac{1}{4}C_1$. Moreover, series coupled capacitors 316 through 322 become coupled in parallel to the capacitor 304. Where capacitor 304 has a capacitance of C, the resulting equivalent capacitance becomes $C+\frac{1}{4}C_1$. Moreover, the time constant of the switched capacitor resonator 300 is modified in a known way. When transistor 324 is in the off state, capacitors 316 through 322 are de-coupled from fixed LC resonator 301 and, therefore, do not have a significant effect on its time constant. Thus, transistor 324 can be used to change the time constant of fixed LC resonator 301 in a known way.

The operation of switched capacitors 308 through 314 is similar to switched capacitor 306. Importantly, however, the associated capacitive contributions of switched capacitors 308 through 314 are $\frac{1}{2}C_1, C_1, 2C_1$ and $4C_1$, respectively. With these capacitive values, there is provided a wide range of adjustment to fixed LC resonator 301. In one embodiment, more similarly configured switched capacitors (not shown) are provided to allow a wider range of adjustment to fixed LC resonator 301. In another embodiment, resistors 360 through 378 are provided to allow further adjustment to fixed LC resonator 301. In another embodiment, resistors 360 through 378 are provided to allow dissipation of charge from the capacitors to which they are coupled. In yet another embodiment, resistors 360 through 378 are provided for optimal biasing of transistors 324, 330, 336, 342 and 348 without degrading the Q of the effective resonant network.

In another embodiment of the invention, shown in FIG. 4, switched capacitor resonator 400 includes fixed LC resonator 402 and switched capacitor array 404 including various switched capacitors as described with reference to FIG. 3. Moreover, switched capacitor resonator 400 further includes adjustable capacitor array 406 in order to compensate switched capacitor 400 for beat issues. Adjustable capacitor array 406 is implemented in a similar manner to switched capacitor array 404, but can be configured to provide different ranges of adjustment for frequencies and time constants of interest. Adjustable capacitor array 406 is provided for situations where a beat frequency produced in conjunction with other circuitry, is closely centered about the center frequency of switched capacitor resonator 400. In general, switched capacitor array 404 is provided to account for variation in component tolerances and adjustable capacitor array 406 is provided to account for beating or other circuit-specific or frequency-specific issues. Switched capacitor arrays can be used in other ways to account for issues arising in many other applications.

Figure 4:
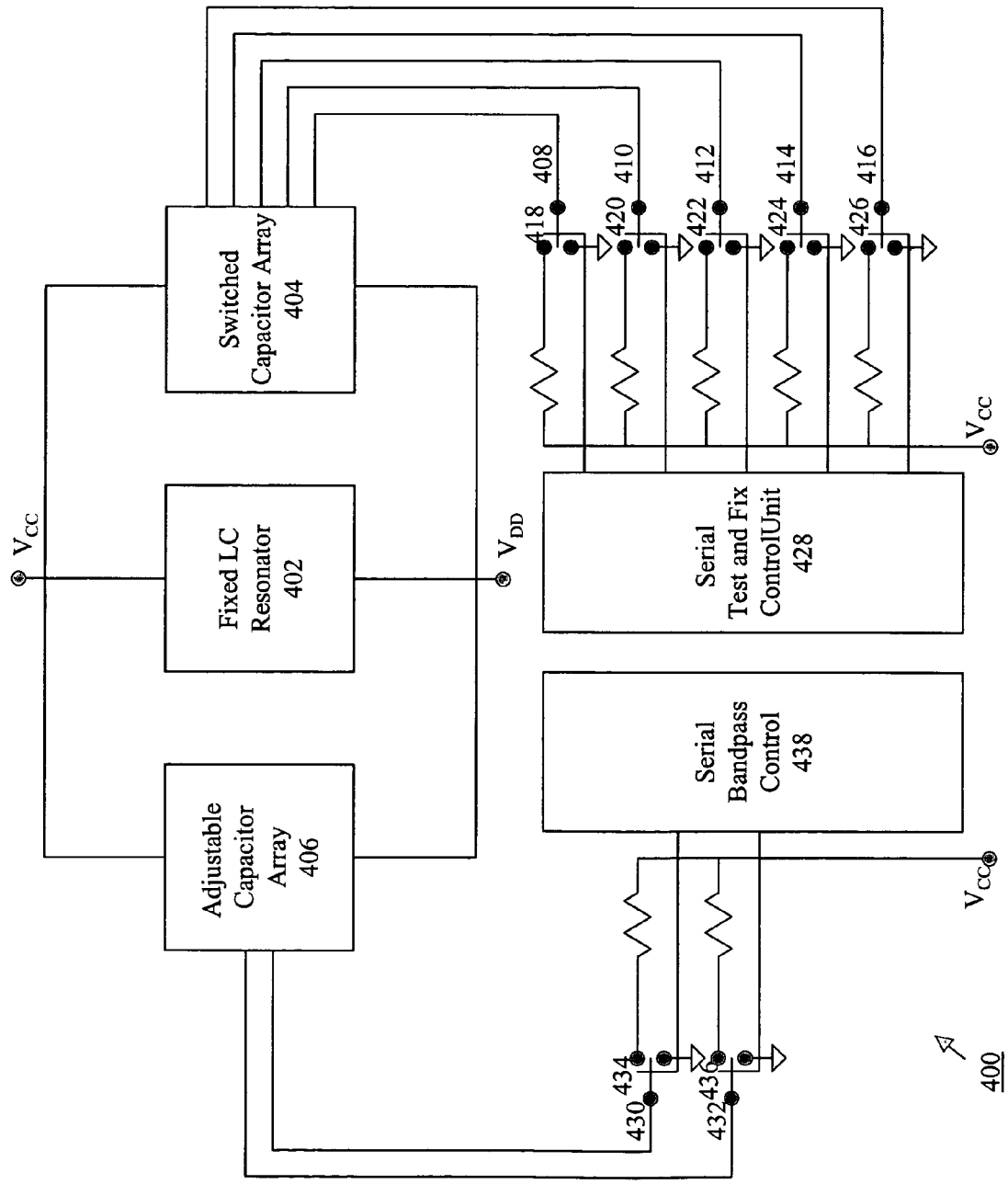
FIG. 4 is a block diagram of an embodiment of a circuit configured to set the tuning of a switched capacitor resonator.

Further shown in FIG. 4 are switch lines 408 through 416 which respectively correspond to switch lines 350 through 358 of FIG. 3 that control the states of transistors 324, 330, 336, 342, and 348. Through measurements and tests, an appropriate combination of switched capacitors can be determined that tunes Fixed LC resonator 402. Having determined an appropriate combination, it is desirable to permanently set or "hard wire" the appropriate combination. In an embodiment of the invention, permanently setting the appropriately chosen switched capacitors is achieved through blowing or not blowing appropriately chosen fuses of fuses 418 through 426. In this manner, transistors of each switched capacitor are set either on or off as desired. In an embodiment of the invention, serial test and fix control unit 428 is used to test and fix (set) the fuses 418 through 426 in an appropriate state.

One example of a serial control interface is the inter-IC ($I^2C$ or I2C) bus, a two-wire serial bus used to control inter-integrated circuit operations. One wire is the Serial Clock Line (SCL), and the other is the Serial Data Line (SDL). The bus is controlled by a bus master device that tells slave devices when they can access the bus. Each slave has a unique 7-bit or 10-bit address. When the master device accesses a slave, it sends the address and a read/write bit. Then, the addressed slave acknowledges the connection and the master can send or receive data to or from the slave. Other serial interfaces may be appropriate, and parallel or serial-parallel interfaces may be appropriate, too.

With fixed LC resonator 402 tuned to compensate for variations in inductor and capacitor values it may still be necessary to tune fixed LC resonator 402 to compensate for beating issues. Beating, the constructive and destructive interaction of two signals of different frequency, can become a significant issue when implementing an integrated tuner of the present invention with other electronic components. The beat frequency is equal to the absolute value of the difference in frequency of two signals. Switched capacitor resonator 400 can be further configured to reduce or eliminate such beating.

In another embodiment of the invention, as shown in FIG. 4, switched capacitor resonator 400 further includes adjustable capacitor array 404 which includes various switched capacitors similar to those described with reference to FIG. 3. Adjustments necessary to reduce or eliminate beating can be much different than adjustments associated with IF filtering issues. Accordingly, the range of adjustment of adjustable capacitor array 406 can be significantly different from the range of switched capacitor array 404; however, the general characteristics are similar. To set adjustable capacitor array 406, it is coupled to control lines 430 and 432. Moreover, fuses 434 and 436 may be provided for permanently setting the configuration of adjustable capacitor array 406. Serial bandpass control unit 438 is provided for setting fuses 434 and 436 as necessary.

Alternatively, in some embodiments, fuses 434 and 436 may be substituted for some other form of programmable storage location, such as an EEPROM cell, EPROM cell, ROM cell, flip-flop, or bits of a register for example. Similarly, it may be appropriate to use an alternative form of storage location for fuses 418 through 426. Also, various embodiments of the switched capacitive arrays may utilize more or fewer capacitors and associated transistors, allowing for different tuning resolutions and design requirements, and requiring a different number of control lines. Furthermore, note that in some embodiments, a lookup table of values may be used for purposes of programming one of the switched capacitive arrays, allowing for programming based on expected performance or characteristics of the overall system and for rapid programming responsive to predetermined conditions.

Figure 5:
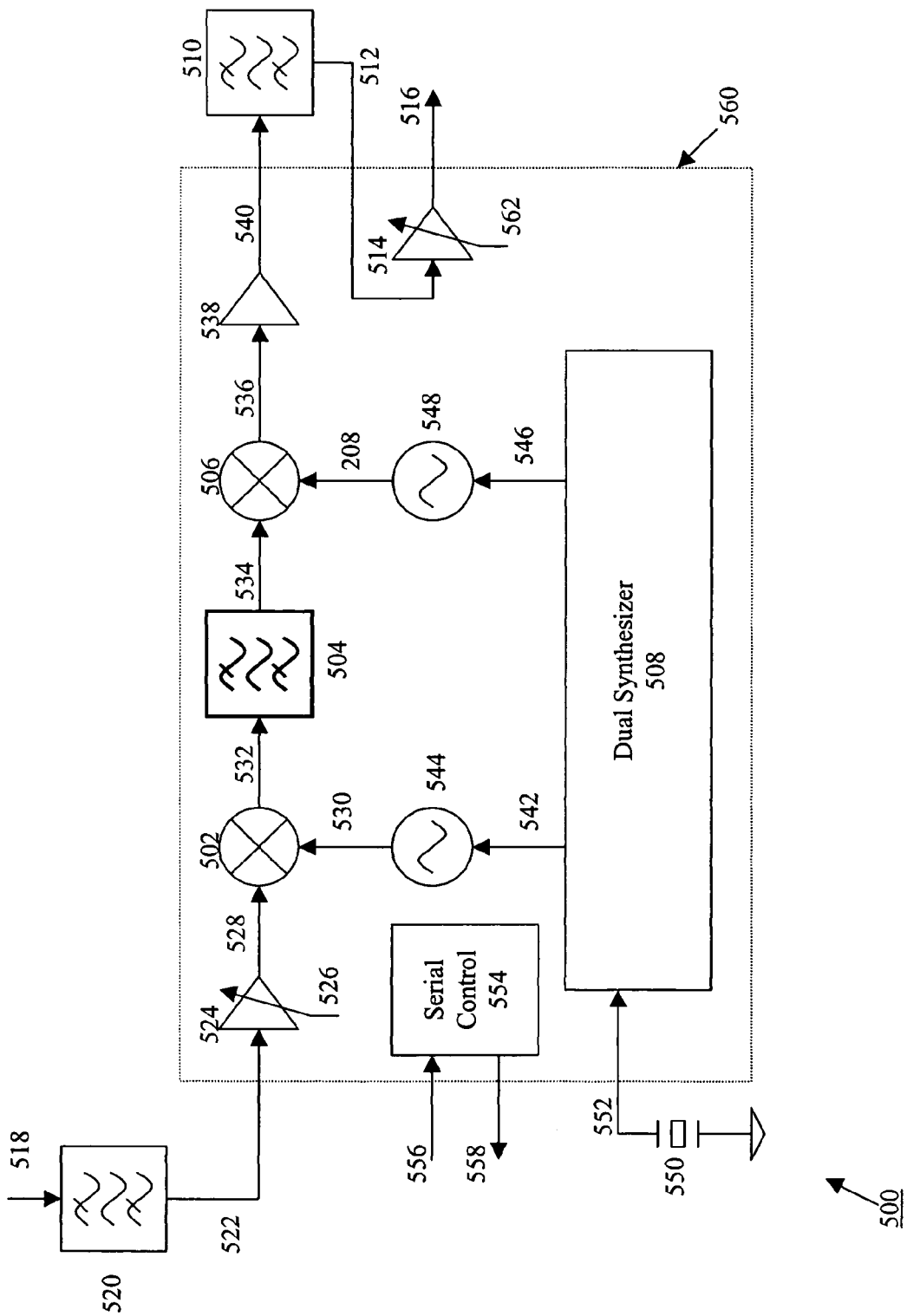
FIG. 5 is a block diagram of an embodiment of an integrated dual-conversion tuner with a switched capacitor resonator configured to perform IF filtering.

As previously described, IF filters are typically not integrated within an integrated tuner for various reasons. One reason is that tuning of the IF filter is usually necessary. Because the filter of the present invention solves the tuning problem, it can, therefore, be more readily integrated with a tuner. Shown in FIG. 5 is tuner 500 that includes switched capacitor resonator-based IF filter 504 within integrated tuner 560. Significant features of integrated tuner 560 include mixers that operate similarly to mixers 202 and 204 of FIG. 2. Importantly, however, switched capacitor resonator 504, coupled between mixers 502 and 506, operates as an IF filter similar to filter 244 of FIG. 2. Also, serial control circuitry 556 operates similarly to serial control circuitry 256 of FIG. 2, however, because of the increased functionality of integrated tuner 500, and in particular, filter 504, serial control circuitry further includes appropriate controls for filter 504.

The switched capacitor resonator of the present invention can, therefore, operate as a filter and, in particular, as a bandpass filter appropriate for use in a television tuner. The switched capacitor resonator, or filter, of the present invention is tuned by measuring response characteristics at the various settings of a switched capacitor array. In measuring a television signal, for example, both within the desired passband and at the image frequency, it is possible to determine an optimal setting for the switched capacitor array. In one embodiment, the switched capacitor array is provided with fuse links that can be set or "blown" to fix the desired response of the bandpass filter of the present invention.

In another embodiment, an inter-stage amplifier is added such that two or more filters can be used to achieve additional rejection of unwanted signals. These filters can be identical or different and have independently controlled capacitor arrays to further improve the response of the tuner.

In yet another embodiment of the invention, a second switched capacitor array is provided that can be controlled by the user to provide further tuning capability. This embodiment provides for the avoidance of known difference beat products that fall within a desired channel. Moreover, this added control allows for the integration on a single integrated circuit of two local oscillators LO1 544 and LO2 548, as shown in FIG. 5, while maintaining acceptable performance. Local oscillators LO1 544 and LO2 548 are configured as voltage controlled oscillators (VCOs) that receive appropriate control signals from dual synthesizer 508.

As shown integrated tuner 560 is further provided with filter 510 and amplifier 514 for meeting case linearity requirements. As shown, amplifier 514 buffers filtered integrated tuner output signal 540 to generate output signal 516. To complement the automatic gain control 526 of amplifier 524, amplifier 514 can also be provided with automatic gain control 562.

Figure 6:
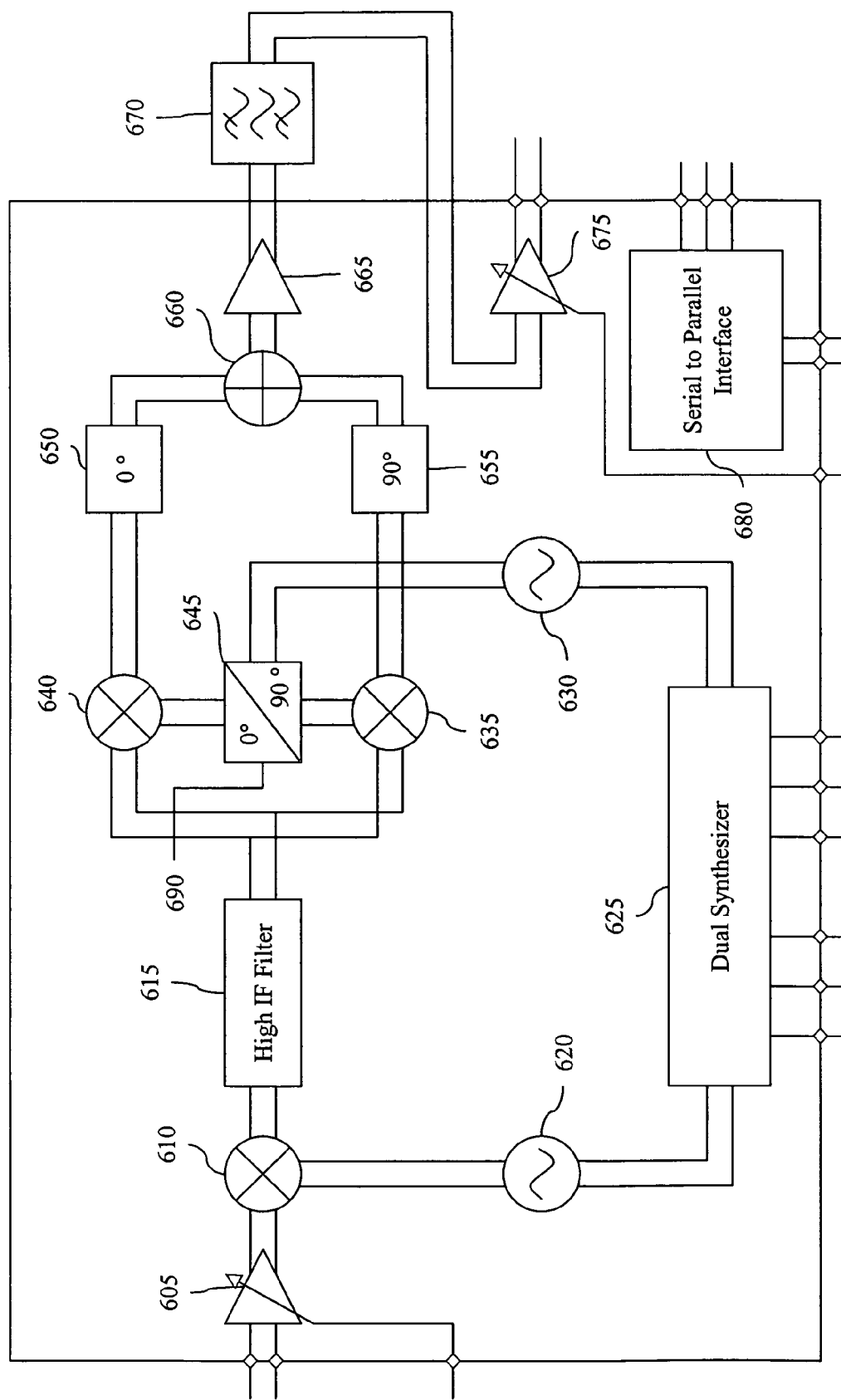
FIG. 6 is a block diagram of an alternate embodiment of an integrated dual-conversion tuner with a switched capacitor resonator configured to perform IF filtering.

As discussed, alternate embodiments may be suitable for implementation. FIG. 6 illustrates an alternate embodiment of a tuner which utilizes an IF filter including a switched capacitor array. Tuner 600 includes an amplifier, an upconversion stage, an IF filter, a downconversion stage, another amplifier, a bandpass filter, and yet another amplifier. Amplifier 605 includes variable (automatic) gain control and receives an input signal. Coupled to the output of amplifier 605 is mixer 610, which also receives an output from oscillator 620. Oscillator 620 and oscillator 630 are controlled by dual synthesizer 625, which causes the oscillators 620 and 630 to output desired frequency signals.

High IF filter 615 receives the output of mixer 610 (the output of amplifier 605 mixed with the signal from local oscillator 620). Filter 615 is an intermediate frequency filter implemented with an LC resonator and one or more switched capacitor arrays for trimming. As such, filter 615 may be tuned to reject beats associated with the combination of oscillators 620 and 630 and may be tuned to respond appropriately despite variations in the inductor and capacitor of the included LC resonator.

The output of filter 615 is coupled to mixers 640 and 635. Mixer 640 receives the 0° phase of the output of oscillator 630 from quadrature generator 645, while mixer 635 receives the 90° phase of the output of oscillator 630 from quadrature generator 645. The outputs of mixers 635 and 640 are coupled to delay lines 655 and 650 respectively, which pass through the 0° phase and delay the 90° phase by an additional 90° before the two signals are then summed at adder 660. The output of adder 660 is provided to the amplifier 665, and, in amplified form, is passed through bandpass filter 670 to another amplifier 675 which has a variable gain control included. Note that the combination of quadrature generator 645, mixers 635 and 640, delay lines 650 and 655, and adder 660 make up a common image rejection mixer, thus indicating that IF filter 615 may or may not need to include an image rejection stage. Other image rejection mixers or filter stages may be appropriate in other embodiments. Furthermore, quadrature generator 645 may have a disable input 690 which may be used to disable the 90° phase output, thereby disabling the image rejection characteristics of the image rejection mixer, and allowing for more effective testing of IF filter 615.

In some embodiments, the input of the above system is the compound signal from a coaxial cable or antenna and the output of the above system may be expected to be a television signal which may be utilized to provide a digital or analog television picture. In such instances, the IF filter 615 may be implemented as a filter such as that illustrated in FIG. 7. Alternatively, a filter such as that illustrated in FIG. 3 may be utilized.

Figure 7:
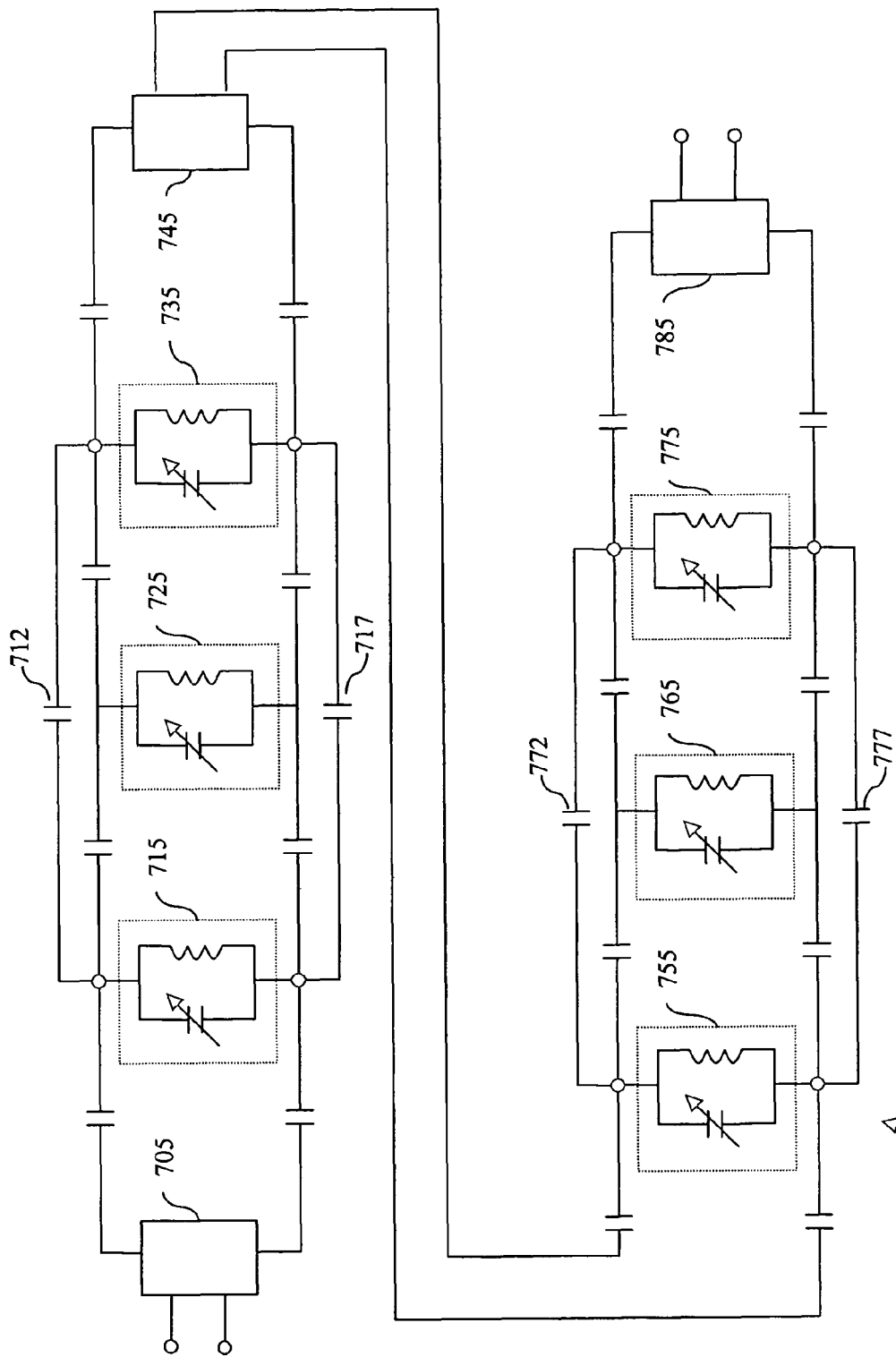
FIG. 7 is a schematic of an alternate embodiment of an IF filter.

Illustrated in FIG. 7 is an alternate embodiment of a filter including switched capacitor arrays. Filter 700 of FIG. 7 may be understood as a two stage filter, with a bandpass stage and an image rejection stage, and with amplifiers at the input, intermediate and output positions of filter 700. Module 705 is an initial amplifier which may be used for isolation purposes, may be used to automatically adjust the magnitude of a signal and terminate (impedance match) the signal, and may also be used to strengthen a signal which is expected to lose strength within the filter. Modules 715, 725 and 735 are distinct LC resonators including a capacitor and an inductor, and each of which includes a switched capacitor array as represented by the variable capacitance. In one embodiment, the combination of modules 715, 725 and 735 implement a bandpass filter with relatively low image rejection and loss characteristics.

Moreover, in one embodiment, capacitors 712 and 717 are selected with a predetermined value which, through coupling two non-adjacent modules (715 and 735), implement an image trap. The image trap provides for image rejection (a transmission zero or near-zero) at a predetermined frequency based on the predetermined value of the capacitors. Note that the predetermined value of these capacitors 712 and 717 may be determined within a relatively wide tolerance, thus allowing the system designer to avoid attempting to tightly constrain the capacitance values in question and to avoid including circuitry suitable for adjusting these capacitance values.

Coupled to the output of modules 715, 725 and 735 is intermediate stage amplifier 745, which further boosts the signal and terminates both the bandpass filter stage and the image rejection stage. Coupled to the output of amplifier 745 are modules 755, 765 and 775. Each of modules 755, 765 and 775 are distinct LC resonators including a capacitor and an inductor, and each of which includes a switched capacitor array as represented by the variable capacitance. In one embodiment, the combination of modules 755, 765 and 775 implement an image rejection filter with relatively high image rejection including a notch at a predetermined image frequency and relatively high loss characteristics compared to the bandpass filter of modules 715, 725 and 735. Also, in one embodiment, capacitors 772 and 777 are selected with a predetermined value which, through coupling two non-adjacent modules (755 and 775), implement an image trap. The output of the image rejection filter is coupled to amplifier 785, which provides the output of the overall filter and terminates the image rejection filter stage.

In some embodiments, the input to a tuner is on a 45.75 MHz carrier which is then mixed with a significantly higher frequency carrier (Frequency X) prior to input to the IF filter. One result of this mixing is an undesired image of the input signal at a frequency twice the carrier (91.5 MHz) below the higher frequency carrier, or an image at X-91.5 MHz. Rejecting this frequency even at a cost of higher then desirable loss characteristics may thus be valuable, and the image rejection filter of modules 755, 765 and 775 may be useful for this purpose. In such an instance, the bandpass filter of modules 715, 725 and 735 may be useful for reducing noise from other sources, while providing a relatively low level of insertion loss. However, alternate embodiments may be implemented in which only a single filter stage or some other arrangement is used. In each embodiment, the presence of one or more switched capacitor arrays may be useful for tuning the filter in question based on manufacturing and customization variations in the underlying system design.

Note that the embodiment illustrated in FIG. 7 uses a balanced approach. However, a single-ended approach may also be appropriate in some instances. An otherwise unbalanced approach may have merits due to various design constraints, too. Also, note that the capacitors coupling the adjacent modules or tanks of the filter stages may be implemented with appropriate capacitances values having large tolerances relative to the tolerances for the capacitance of the LC resonator.

The methods implemented by the various embodiments may be classified into two general areas, manufacturing methods and operational methods. FIG. 8 is a flow diagram of an embodiment of a method of tuning an IF filter. Method 800 of FIG. 8 is a manufacturing method useful for tuning a filter based on process and component variations within expected tolerances. At operation 810, a tunable filter (separately or as part of a system) is received. At operation 820, the filter is tested to determine its current characteristics or operational profile. At operation 830, the filter is tuned to an operational profile closer to a predetermined operational profile. At operation 840, a determination is made as to whether the filter is sufficiently well tuned, as to whether its operational profile or response is within predetermined limits. If not, the process returns to operation 820. If the filter is sufficiently well tuned, at operation 850 the filter may be completed, such as by writing a serial number or validation code into an associated internal ID register for example. Such a completion operation may not be necessary, the filter may effectively be manufactured and tested when tuning is complete.

After manufacture, the filter may be used within a system which has different characteristics than the expected nominal characteristics for which it was designed. FIG. 9 is a flow diagram of an alternate embodiment of a method of tuning an IF filter. Method 900 of FIG. 9 is exemplary of an operational method of tuning an IF filter. At operation 910, the filter is operated. At operation 920, the frequency used in the overall system is shifted. At operation 930, the filter characteristics are shifted responsive to the shift of operation 920. Such a shift may result from changing a channel in a set-top box for example, or may result from shifts in operating characteristics of other components within a system for example. Note that the method illustrated may be repeated as needed during operation of the filter. Note also that the shift in filter characteristics may be effected by programming values from a lookup table into a register for example, thereby allowing for predetermined responses to expected changes in operating conditions. Alternatively, some variant of trial and error may be used to determine a preferred tuning status for the filter, based on changes to the filter and observed performance.

From the foregoing, it will be appreciated that specific embodiments of the invention have been described herein for purposes of illustration, but that various modifications may be made without deviating from the spirit and scope of the invention. In some instances, reference has been made to characteristics likely to be present in various or some embodiments, but these characteristics are also not necessarily limiting on the spirit and scope of the invention. In the illustrations and description, structures have been provided which may be formed or assembled in other ways within the spirit and scope of the invention. Similarly, methods have been illustrated and described as linear processes, but such methods may have operations reordered or implemented in parallel within the spirit and scope of the invention. Accordingly, the invention is not limited except as by the appended claims.

We claim:

1. An intermediate frequency filter for use in an integrated circuit, comprising:

a first filter stage, the first filter stage including a first LC resonator; and
the first filter stage further including a first adjustable capacitor array coupled to the first LC resonator, wherein the first adjustable capacitor includes one or more switched capacitor blocks, each switched capacitor block having at least one capacitor coupled in series with a switch and further coupled in series with at least one other capacitor, the first adjustable capacitor array having an effective capacitance value adjustable through use of the switch in each switched capacitor block, further wherein each switch is coupled to a switching line programmable through a serial control interface.

2. The filter of claim 1, wherein:
the first filter stage further including a second adjustable capacitor array coupled to the LC resonator, the second adjustable capacitor array having an effective capacitance value adjustable through use of a second plurality of data storage locations, the second plurality of data storage locations programmable through the serial control interface.

3. The filter of claim 2, wherein:
the data storage locations of the second plurality of data storage locations are fuses.

4. The filter of claim 1, wherein:
a first switched capacitor block including a first capacitor of a first magnitude coupled in series with a first switch and further coupled in series with a second capacitor of the first magnitude, the first switch controlled by a first switching line; and a second switched capacitor block including a third capacitor of a second magnitude coupled in series with a second switch and further coupled in series with a fourth capacitor of the second magnitude, the second switch controlled by a second switching line, the combination of the third capacitor, second switch and fourth capacitor coupled in parallel with the combination of the first capacitor, first switch and second capacitor.

5. The filter of claim 1, wherein at least a capacitor of the LC resonator is part of the integrated circuit.

6. The filter of claim 1, wherein each switch is controlled by a programmable data storage location that is programmable through the serial control interface of the integrated circuit.

7. The filter of claim 6, wherein each programmable data storage location is programmable through a set of test points on the integrated circuit.

8. The filter of claim 1, wherein each switching line is coupled to a fuse.

9. The filter of claim 1, wherein each switch comprises a transistor.

10. The filter of claim 1, wherein each specific switched capacitor block is enabled or disabled using a control signal input to the switch via the switching line of the specific switched capacitor block, and a capacitance value of the specific switched capacitor block is set using the same control signal input to the switch.

11. A circuit formed as part of a single integrated circuit, the circuit comprising:
a first amplifier;
a first oscillator;
a first mixer coupled to the first amplifier and the first oscillator;
a second oscillator;
a second mixer coupled to the second oscillator;
a second amplifier coupled to the second mixer;
a serial control module;
an intermediate frequency filter (IF filter), the IF filter including a first filter stage, the first filter stage including a first LC resonator;
the first filter stage further including a first adjustable capacitor array coupled to the first LC resonator, wherein the first adjustable capacitor includes one or more switched capacitor blocks, each switched capacitor block having at least one capacitor coupled in series with a switch and further coupled in series with at least one other capacitor, the first adjustable capacitor array having an effective capacitance value adjustable through use of the switch in each switched capacitor block, further wherein each switch is coupled to a switching line programmable through the serial control module;
and wherein the second mixer is coupled to the IF filter and the IF filter is coupled to the first mixer.

12. The circuit of claim 11, wherein the first filter stage further includes:
a second adjustable capacitor array coupled to the LC resonator, the second adjustable capacitor array having an effective capacitance value adjustable through use of a first plurality of data storage locations, the first plurality of data storage locations programmable through the serial control interface.

* * * * *